United States Patent [19]

Yamaguchi

[11] Patent Number: 5,250,470
[45] Date of Patent: Oct. 5, 1993

[54] METHOD FOR MANUFACTURING A SEMICONDUCTOR DEVICE WITH CORROSION RESISTANT LEADS

[75] Inventor: Tadashi Yamaguchi, Tokyo, Japan

[73] Assignee: Oki Electric Industry Co., Ltd., Tokyo, Japan

[21] Appl. No.: 826,689

[22] Filed: Jan. 29, 1992

Related U.S. Application Data

[62] Division of Ser. No. 627,413, Dec. 14, 1990, abandoned.

[30] Foreign Application Priority Data

Dec. 22, 1989 [JP] Japan .................. 1-331028

[51] Int. Cl.⁵ .............. H01L 21/56; H01L 21/58; H01L 21/60
[52] U.S. Cl. ...................... 437/211; 437/220
[58] Field of Search ........ 357/72, 70, 74, 80; 235/488, 489, 492; 437/211, 220; 264/272, 17; 205/150, 157, 920

[56] References Cited

U.S. PATENT DOCUMENTS

| | | | |
|---|---|---|---|
| 3,778,887 | 12/1973 | Suzuki et al. | 29/588 |
| 4,806,409 | 2/1989 | Walter et al. | 29/827 |
| 4,843,225 | 6/1989 | Hoppe | 357/72 |
| 4,860,087 | 8/1989 | Matsubara et al. | 357/68 |
| 4,962,415 | 10/1990 | Yamamoto et al. | 235/492 |
| 5,036,380 | 7/1991 | Chase | 437/220 |

FOREIGN PATENT DOCUMENTS

| | | |
|---|---|---|
| 2942397 | 4/1980 | European Pat. Off. . |
| 297991 | 1/1989 | European Pat. Off. . |
| 0240628 | 11/1986 | Fed. Rep. of Germany ...... 437/218 |
| 55-56647 | 4/1980 | Japan . |
| 61-3288 | 1/1986 | Japan . |
| 2035701 | 6/1980 | United Kingdom . |

OTHER PUBLICATIONS

"IC Card" Terada, K. K. Nihon Kogyo Gi Jutsu Center, Mar. 28, 1986, pp. 132–159.

Primary Examiner—Olik Chaudhuri
Assistant Examiner—David E. Graybill
Attorney, Agent, or Firm—Spencer, Frank & Schneider

[57] ABSTRACT

A method for manufacturing semiconductor device comprising a semiconductor element having pads, a supporting member having a mount region on which the semiconductor element is mounted, and a plurality of leads pattern-formed on the supporting member. Each of the leads has a first end positioned near the mount region, and a second end. Conductors are provided for connecting the first ends of the leads to the pads of the semiconductor elements. Sealing material is provided for sealing at least the conductors, the semiconductor element and the second ends of the plurality of leads. The second ends of the leads are collected together in a branch area arranged along the circumference of the supporting member.

22 Claims, 6 Drawing Sheets

METHOD FOR MANUFACTURING A SEMICONDUCTOR DEVICE WITH CORROSION RESISTANT LEADS This application is a divisional of application Ser. No. 07/627,413, filed Dec. 14, 1990, now abandoned.

FIELD OF THE INVENTION

The present invention relates to a semiconductor device of a thin package type used in IC cards or the like, and a method of its fabrication.

BACKGROUND OF THE INVENTION

Semiconductor integrated circuits which are used in watches, cameras, IC cards and the like are required to be of a packaged construction which is as thin as 0.5 to 2 mm.

An example of a prior art semiconductor device having a thin package construction is shown for example in the Japanese Kokai Publication No. 55-56647. This is a so-called chip-on-board (COB) member in which a semiconductor element such as a semiconductor integrated circuit is directly mounted on a printed circuit board (PCB) formed for example of glass epoxy resin, and metal conductors on the PCB are connected by wire and sealing by epoxy resin or the like is made.

The structure of the prior art semiconductor device of the thin package construction is illustrated in FIG. 1.

In FIG. 1, reference numeral 1 denotes a PCB formed for example of glass epoxy resin. The illustrated PCB is part of a row of PCBs which are connected by a pair of ribbon parts 1A, 1B and pairs of bridging parts 1C and 1D for the respective PCBs 1, as illustrated in FIG. 2.

Such a row of PCBs is formed in the following manner. First, a band-shaped board member S formed for example of glass epoxy is provided, as shown in FIG. 3. A conductive pattern comprising circuit leads 2 and plating leads 5 is formed on the front surface of the board member S, and is connected via throughholes 3 to a terminal pattern 4 formed on the rear surface. The conductive pattern is formed by removing, by means of etching or the like, unnecessary parts of the metal thin film (e.g. of copper) that has been previously stuck to the front surface of the board member S, and applying electroplating of Ni, Au or the like on the surface using the plating leads 5 for conduction of electric current. Thereafter, drilling or other processing techniques are used to form a spot-faced or indented portion (region) 6 for mounting the semiconductor element. Then, stamp-pressing or another method is used to obtain the combination of the row of PCBs 1, the ribbon parts 1A and 1B, and bridging parts 1C and 1D, as shown in FIG. 2.

Plating leads (shown by broken lines) in FIG. 1 are partially removed together with the unnecessary part (which will not become part of the PCBs) of the board member S. At the cut parts 7 of the plating leads at the edge of the PCB 1, a metal thin film which is not covered with any plating layer is exposed.

Then, as shown in FIG. 4, a semiconductor element 8 is bonded by adhesive material to a predetermined position of the spot-faced or indented portion 6 on the PCB 1, and wires 9 are used for connecting the circuit leads 2 with the pads on the semiconductor element 8.

Subsequently, a transfer mold or other means is used for sealing and shaping with a sealing resin 10. During this transfer molding, a die, not shown, is placed over the PCBs and a runner 11 (FIG. 4), which will be described later. Then, press-cutting pressing or the like is used for separating each PCB from the bridging parts and the ribbon parts, to obtain a module. In FIG. 4, the state after the transfer molding and before the subsequent separation into individual modules is shown. The runner 11 and the above described die form the flow path for the sealing resin 10. A gate 12 serving as a flow inlet to the sealing part is also illustrated.

FIG. 5 shows the completed product after the separation into individual units (modules). FIG. 6 and FIG. 7 show sections along line VI—VI, and VII—VII respectively, in FIG. 5. In the figures, 1 denotes the PCB, 2 denotes the circuit lead, 3 denotes the throughhole, 4 denotes the terminal pattern, 5 denotes the plating lead, 6 denotes the spot-faced portion, 7 denotes the plating lead cut part, 8 denotes the semiconductor element, 9 denotes the wire, and 10 denotes the sealing resin. 13 denotes the gate remainder which results after removal of the runner 11 and the gate (see FIGS. 5 and 6) 12.

In the device of the above structure, during the processing of the board member S into the combination as shown in FIG. 2, the metal thin film which is not covered with a plating layer as a protective film, is exposed at the part where the plating lead is cut. Therefore, since the metal thin film is formed of Cu which is easily attacked by corrosive material often present in the environment, the metal thin film becomes corroded or otherwise becomes unsuitable after use over the years.

Moreover, a gate remainder may result in the vicinity of the inlet of the sealing material when the runner and the gate are removed after sealing with resin. Such a gate remainder may cause adverse effects when the device is built in a very thin package of, for instance, a card.

SUMMARY OF THE INVENTION

An object of the invention is to solve the problems due to the exposure of the metal thin film which, as a result, is easily corroded and the gate remainder in the vicinity of the inlet for the sealing material, and to provide a device which is highly reliable and easily fabricated.

A semiconductor device according to the present invention comprises:

a semiconductor element having pads;

a supporting member having a mount region on which said semiconductor element is mounted;

a plurality of leads which are pattern-formed on the supporting member, and which have first ends positioned near said mount region and second ends;

conductors for connecting said first ends of said leads to said pads of the semiconductor elements; and sealing material for sealing at least said conductors and said semiconductor element;

wherein the second ends of said leads are provided collectively at a region along the circumference of the supporting member, and sealed by said sealing material.

A method of making a semiconductor device according to the present invention comprises the steps of:

providing a board member having first regions which will be a row of supporting members, second regions which will be a pair of ribbon parts extending parallel with each other, and third regions which will be pairs of bridging parts for the respective supporting members and bridging the corresponding supporting members to said pair of ribbon parts, said first regions each having a mount region on which a semiconductor element having pads will be mounted;

forming on each of said board members, a conductive pattern comprising leads having first ends positioned near said mount region and having second ends connected in a branch area to a first end of a common plating lead element extending through one of the corresponding bridging regions;

electroplating a protective film over said conductive pattern using said common plating lead element as a plating lead;

removing the lead elements and said common lead element in said branch area to isolate the individual lead elements from each other;

mounting the semiconductor element on said mount region in each of said first region;

connecting said first ends of said leads and said pads of said semiconductor element by means of conductors; and sealing said branch area, said semiconductor element and said conductors by means of a sealing material.

According to the invention, the second ends of the leads are collectively provided at a part along the circumference of the PCB, so that the ends of the lead are easily sealed by the sealing member, and their corrosion is prevented. Moreover, when the conductive pattern in the branch area is removed to isolate the individual lead elements from each other, the surface part of the support member in the branch area can also be removed to form a groove, and this groove can be utilized as an inlet for the sealing material or for the exhaustion of air during sealing. The gate remainder which is formed of the sealing material is cut away and removed, during separation into individual modules, and a semiconductor device of a desirable shape is obtained. Moreover, there will be no adverse effect when the device is built in a very thin package such as the one for a card.

DETAILED DESCRIPTION OF THE PREFERRED EMBODIMENTS

Figure 1:
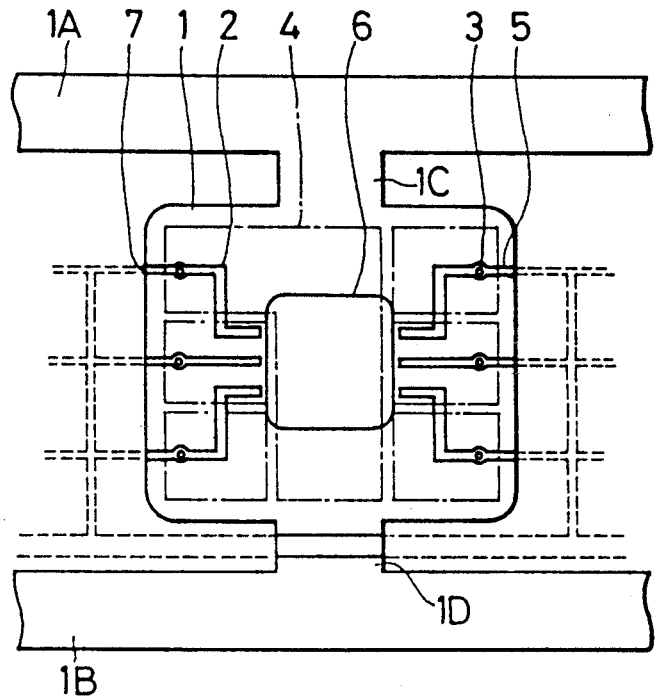
FIG. 1 is a plan view for explaining the prior art semiconductor device.
Figure 2:
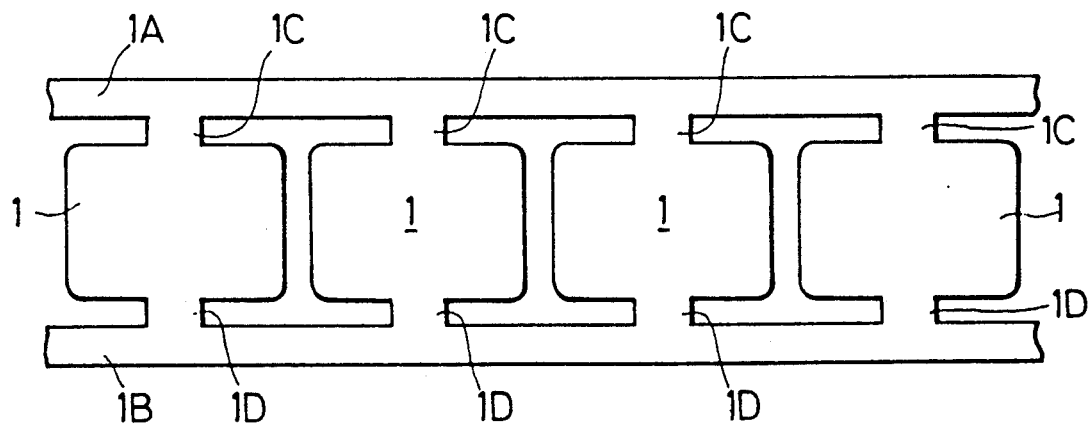
FIG. 2 shows a combination of the PCBs, ribbon parts and bridging parts.
Figure 3:
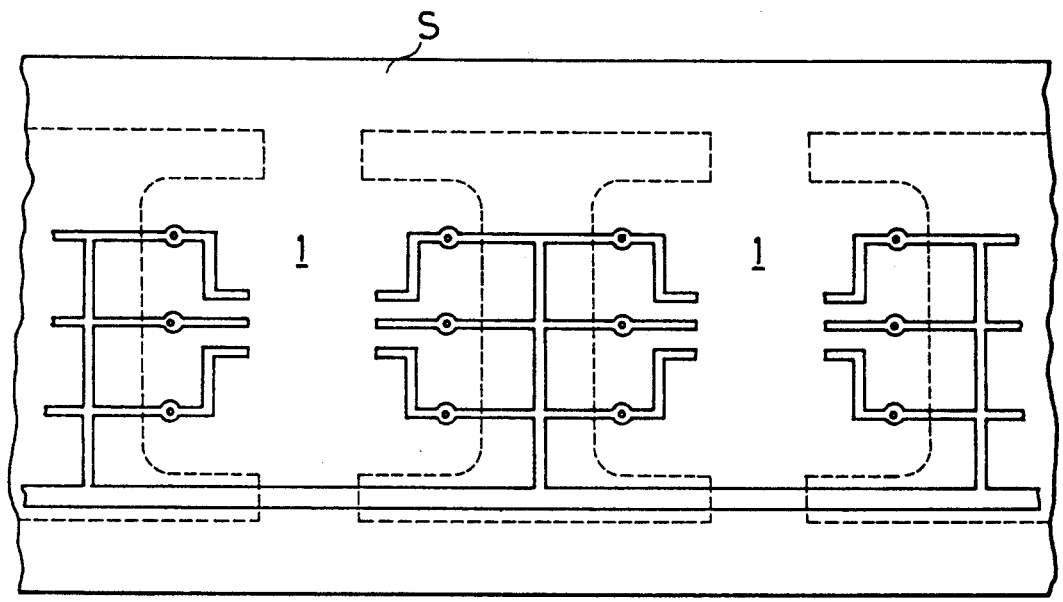
FIG. 3 shows a board member prior to processing into the combination shown in FIG. 2.
Figure 4:
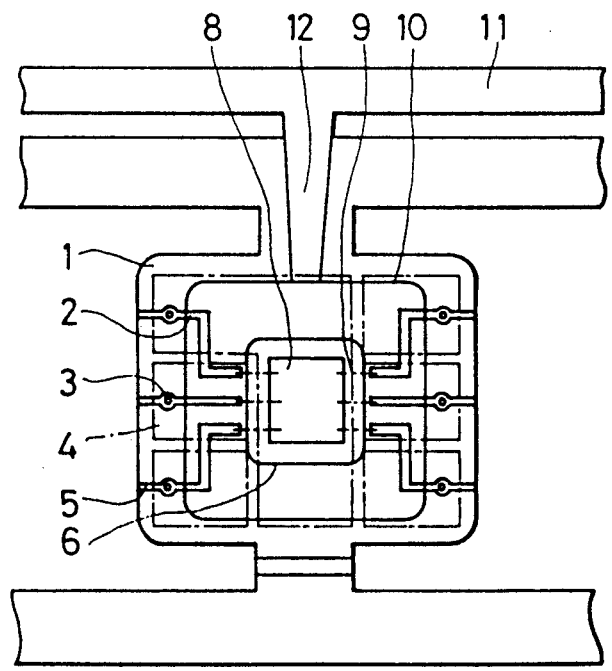
FIG. 4 and FIG. 5 are further plan views for explaining the prior art semiconductor device.
Figure 5:
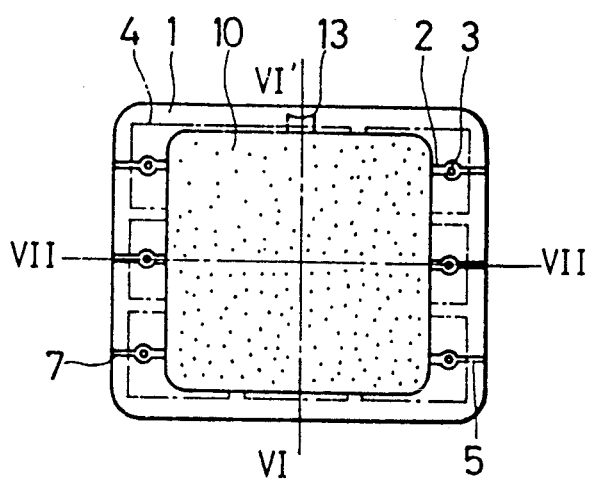
Figure 6:
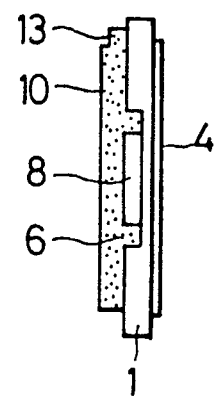
FIG. 6 and FIG. 7 are sectional views of the semiconductor device shown in FIG. 5.
Figure 7:
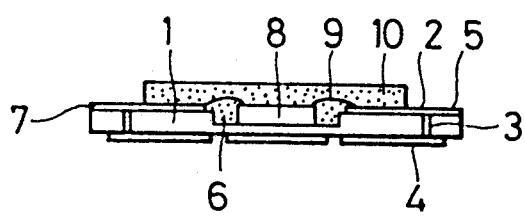
Figure 8:
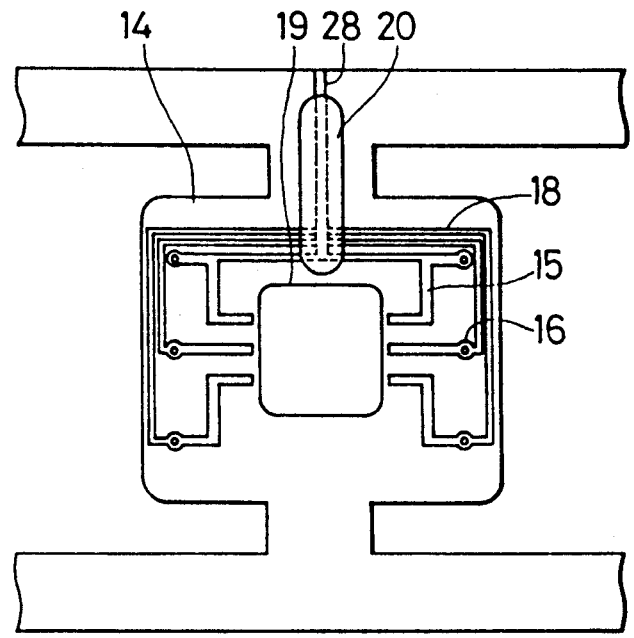
FIG. 8 is a plan view of the semiconductor device for explaining the embodiment of the invention.
Figure 11:
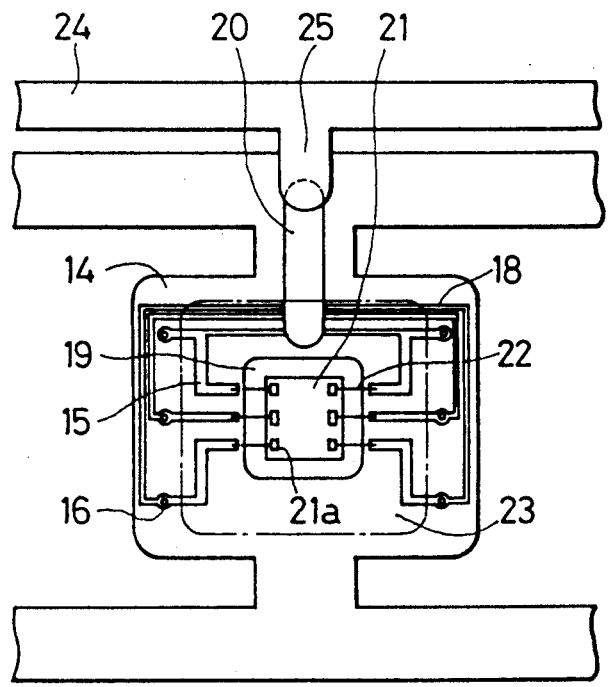
FIG. 11 and FIG. 12 are further plan views of the semiconductor device for explaining the embodiment of the invention.
Figure 12:
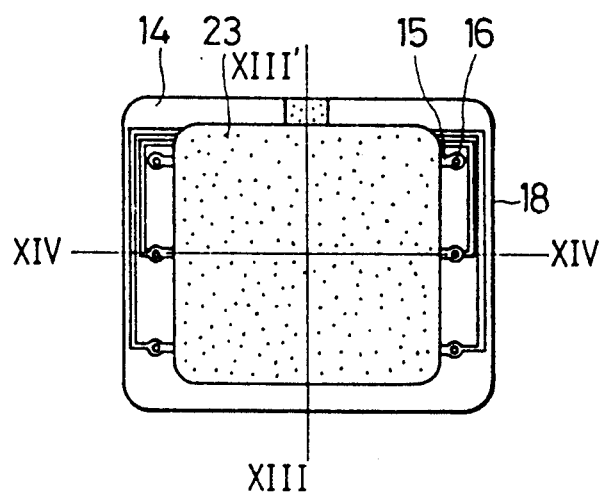
Figure 13:
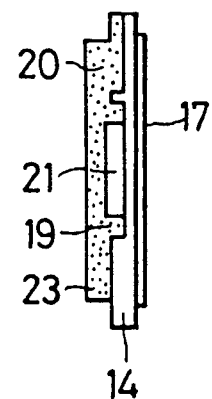
FIG. 13 and FIG. 14 are sectional views of the semiconductor device shown in FIG. 12.
Figure 14:
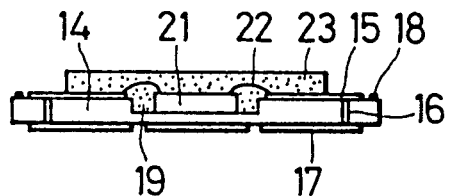

FIG. 8, FIG. 11 and FIG. 12 are plan views of the semiconductor device for explaining an embodiment of the invention. FIG. 13 and FIG. 14 are sectional views of the semiconductor device of FIG. 12. The embodiment will now be described with reference to the drawings.

Figure 9:
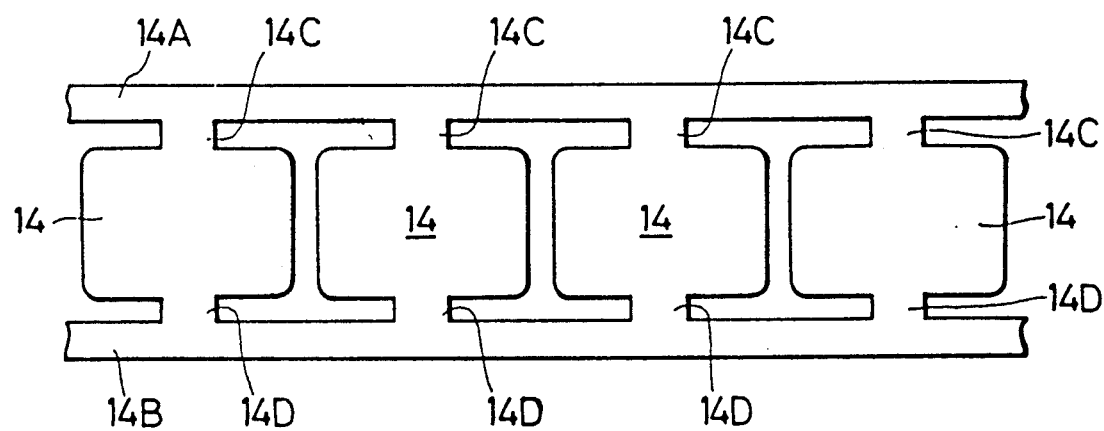
FIG. 9 shows a combination of the PCBs, ribbon parts and bridging parts.

In FIG. 8, 14 denotes a PCB as a semiconductor element supporting member formed of glass epoxy or the like. The illustrated PCB is part of a row of PCBs which are connected by a pair of ribbon parts 14A, 14B and bridging parts 14C and 14D for the respective PCBs 14, as illustrated in FIG. 9.

Figure 10:
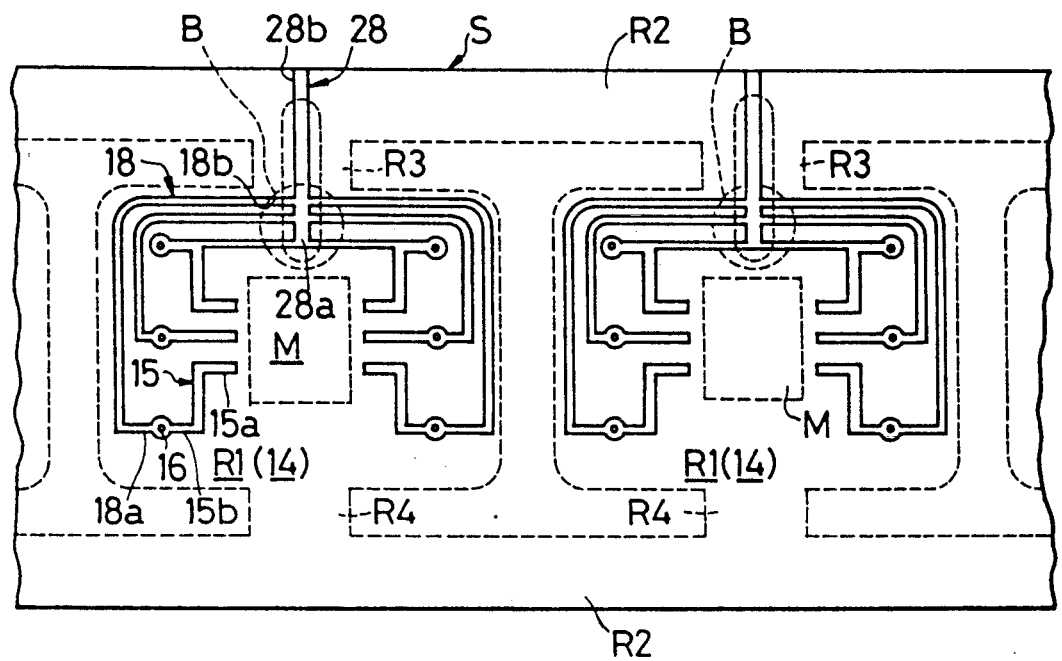
FIG. 10 shows a board member prior to processing into the combination shown in FIG. 9.

Such a row of PCBs is formed in the following manner. First, a glass epoxy film or some other band-shaped board member S shown in FIG. 10 is provided. The board member includes first regions R1 which will be a row of supporting members, second regions R2 which will be ribbon parts extending parallel with each other, and third regions R3 which will be pairs of bridging parts for the respective supporting members 14 and bridging the corresponding supporting member 14 to said pair of ribbon parts. Each of the first regions R1 is formed of a PCB and has a mount region M on which a semiconductor element having pads will be mounted.

Formed on each PCB 14 is a conductive pattern comprising a plurality of circuit leads 15 having first ends 15a positioned near the mount region M (for connection with the semiconductor element to be described later) and having second ends 15b connected via respective throughholes 16 to a terminal pattern 17 formed on the rear surface of the PCB as shown in FIGS. 13 and 14. The conductive pattern also comprises a common plating lead 28 having a first end 28a positioned in a branch area B, extending through the third region R3 and across the second region R2, and having a second end 28b positioned at the edge of the second region R2. The conductive pattern further comprises individual plating leads 18 provided for the respective circuit leads 15, having first ends 18a connected to respective throughholes 16, and second ends 18b collected in the branch area B, and connected to the first end 28a of the common plating lead 28 in the branch area B.

The conductive pattern is formed by selectively removing, by etching or other processing, unnecessary parts of a thin film of metal such as Cu that has been previously stuck to the surface of the PCB 14. The conductive pattern is covered with gold or a like protective film for anticorrosion, by means of electroplating, using the plating leads 18 and 28 for conduction of electric current for the plating.

Conventionally, the plating leads were extended in any directions of the PCB, whereas in the present embodiment, the individual plating leads 18 for all the circuit leads 15 are collected in a branch area B and connected to the common plating lead 28. The second ends 18b of the individual leads 18 are collected in a region which will be sealed by a resin to be described later. The second end 28b of the common plating lead 28 is outside of the region which will be sealed by the resin.

After the plating of the conductive patterns 15, a spot-faced or indented portion (region) 19 is formed by drilling or other processing, and by a similar processing, a groove 20 is formed as shown in FIG. 11. The groove 20 extends from the branch area B across the bridging region R3 and toward the edge of ribbon part R2. The groove 20 cuts and isolates the plating leads 18 and 28 and also serves as a path for the injection of the sealing resin or exhaustion of air while transfer molding is formed on the surface of the PCB 14. Then, stamp-pressing or other means is used to obtain the combination of the row of PCBs 14, the ribbon parts 14A and 14B, and bridging parts 14C and 14D, as shown in FIG. 9.

Subsequently, as shown in FIG. 11, a semiconductor element 21 is fixed, by means of an adhesive or the like, at a predetermined position of the spot-faced portion 19 on the PCB 14, and output pads 21a of the semiconductor element 21 and the first ends 15a of the circuit leads 15 are connected with wires 22.

Then, by means of the transfer molding or other processing, molding of the sealing member of sealing resin 23 is performed, using the groove for injection of the resin or for exhaustion of air. During the transfer molding, a die, not shown, is placed over the semiconductor element 21, the groove 20, and the runner 24. When the sealing resin 23 is injected through the runner 24 and the groove 20, an outlet for the air exhaustion is provided in the die. If the groove 20 is used for the air exhaustion, an inlet for the injection of the sealing resin 23 is provided in the die. Then, by means of press cutting or other processing, separation into individual modules is achieved.

FIG. 11 shows the state after the transfer molding and before the subsequent separation into individual modules. A runner 24 and a gate 25 forming the path of injection for the sealing resin 23 are illustrated. The gate 25 is not in contact with the sealing member as in the prior art, but is partially overlapping the groove 20. Therefore, when the runner 24 and the gate 25 are removed, and a gate remainder is left, but it is in a part which will be removed when separation into individual modules is performed. Moreover, the cut part of the plating lead 18 is completely covered with the sealing resin 23. The problems of the gate remainder and the exposure of the cut parts of Cu of the plating leads 18 which were problematical with the prior art are therefore eliminated.

FIG. 13 and FIG. 14 are sectional views along lines XIII—XIII' and XIV—XIV', respectively, in FIG. 12. 14 denotes a PCB, 15 denotes a conductive pattern, 16 denotes a throughhole, 17 denotes a terminal pattern, 18 denotes a plating lead, 19 denotes a spot-faced part, 20 denotes a groove, 21 denotes a semiconductor element, 22 denotes a wire, and 23 denotes a sealing resin.

As has been described, according to the embodiment of the invention, the conductive pattern comprising the circuit leads 15 and plating leads 18 and 28 are formed of a metal thin film which is easy to corrode and an overlying plating layer formed using the leads 18 and 28 as plating leads, and the parts of the plating leads 18 and 28 connected in the branch area are removed to isolate the leads 18 and 28 from each other, and the cut parts are sealed with sealing resin 23, so the metal thin film which is easily corroded is completely sealed with the sealing resin, so corrosion which may otherwise start with the cut surface of the plating lead 18 is prevented. Moreover, the groove is provided in the branch area B of the board member S, and sealing resin 23 is formed to fill the groove. Thus, unnecessary resin projecting at the semiconductor device surface is avoided and a semiconductor device with a good shape is obtained. Moreover, simultaneously with the removal of the leads in the branch area B, a groove 20 is formed to extend through the branch area B, and is utilized for injection of the sealing resin or exhaustion of air during transfer molding, and the gate remainder is cut and removed together with the unnecessary part 14 of the board member S. A semiconductor device which does not have an unnecessary projecting gate remainder is easily obtained.

In the embodiment described, only one common plating lead is provided for each module. But, there may be a plurality of common plating leads for each module. In such a case, the individual plating leads are divided into the same number of groups as the common plating leads, and the individual plating leads of each group are connected to one of the common plating leads.

What is claimed is:

1. A method of fabrication of a semiconductor device comprising the steps of:

providing a board member having first regions disposed for forming a row of supporting members, second regions disposed for forming a pair of ribbon parts extending parallel with each other, and third regions disposed for forming pairs of bridging parts for the respective supporting members and for bridging the corresponding supporting members to said pair of ribbon parts, said first regions each having a mount region for mounting of a semiconductor element having pads;

forming on each of said first regions, a respective conductive pattern comprising individual lead elements having first ends positioned near said mount region and having second ends connected in a branch area to a first end of a common plating lead element extending through one of the corresponding third regions;

electroplating a protective film over said conductive pattern using said common plating lead element as a plating lead;

removing the parts of said individual lead elements and said common lead element in said branch area to isolate the remaining parts of said individual lead elements from each other;

mounting a semiconductor element having pads on said mount region in each said first region;

connecting said first ends of said leads and pads of said semiconductor element by means of conductors; and sealing said branch area, said semiconductor element and said conductors by means of a sealing material.

2. The method of claim 1, further comprising the step of:

forming, by removing parts of said board member, a combination of said row of supporting members, said pair of ribbon parts, and said bridging parts;

wherein said step of sealing is performed after said step of forming said combination.

3. The method of claim 2, wherein said step of forming said combination comprises a stamp-pressing.

4. The method of claim 1, further comprising the step of separating each supporting member after said step of sealing thereby to produce a packaged module.

5. The method of claim 1, further comprising the step of removing a surface part of the supporting member in said branch area to form a groove in said supporting member.

6. The method of claim 5, wherein said step of removing the surface part of said supporting member in said branch area and said step of removing said pattern in said branch area are performed simultaneously.

7. The method of claim 5, wherein in said step of sealing by means of said sealing material, injection of the sealing material or air exhaustion is made through said groove formed on said supporting member.

8. A method of manufacturing a semiconductor device comprising the steps of:

providing a circuit board having a semiconductor element supporting region including a mount region and a bridging region extending from the supporting region;

on the circuit board, forming a conductive pattern having a plurality of circuit leads and a common plating lead, with each of the circuit leads having a first end positioned near the mount region and a second end, and with the common plating lead having a common portion located on the bridging region and a plurality of branch portions each of which extends from the common portion to a respective second end of the circuit leads;

plating a thin layer on the conductive pattern using the common portion for conduction of electric current for said plating;

mechanically removing the plated common portion of the conductive pattern to electrically isolate the circuit leads from each other, and a surface portion of the bridging region and of the supporting region of the circuit board to form a groove;

mounting a semiconductor element having a plurality of output pads on the mount region of the circuit board; and molding the semiconductor element and the first ends of the circuit leads with a sealing material.

9. A method of manufacturing a semiconductor device according to claim 8, wherein the circuit board further has a ribbon region connected to the bridging regions.

10. A method of manufacturing a semiconductor device according to claim 8, wherein said step of mounting includes the step of electrically connecting the output pads to the respective first ends of the circuit leads.

11. A method of manufacturing a semiconductor device according to claim 8, wherein said step of molding is performed with the groove as an injection path for the sealing material.

12. A method of manufacturing a semiconductor device according to claim 8, wherein said step of molding is performed with the groove as an exhaustion path for air.

13. A method of manufacturing a semiconductor device according to claim 8, further comprising the step of separating the semiconductor element supporting region from the bridging region of the circuit board after said step of molding.

14. A method of manufacturing a chip-on-board type semiconductor device comprising the steps of:
providing a circuit board having
a pair of ribbon regions extending in a first direction,
a plurality of semiconductor chip supporting regions arranged in a row and located between the pair of ribbon regions, each of the supporting regions including a chip mounting region,
a plurality of bridging regions each of which extends from a supporting region to the ribbon region in a second direction substantially at a right angle with the first direction, and
a plurality of press regions each of which is surrounded by the pair of ribbon regions, successive supporting regions, and the bridging regions extending from the successive supporting regions;

forming on at least one supporting region of the circuit board a conductive pattern having
a plurality of circuit leads each of which has a first end positioned near the mount region and a second end,
a common lead extending from the supporting region to the ribbon region across the bridging region, and
a plurality of connecting leads positioned on the supporting region, with the connecting leads extending from the common lead to respective second ends of the circuit leads along the outer side of the mounting region;

electroplating a protective film on the conductive pattern using the common lead as a plating lead;

forming a first groove on the surface of the mounting region of the circuit board and a second groove on the surface of the circuit board to remove the common lead, with the second groove extending from the outer side of the mounting region to the ribbon portion through the bridging region;

mounting a semiconductor chip having a plurality of output pads on the base surface of the first groove; and molding the semiconductor chip and the first ends of the circuit leads by a sealing material.

15. A method of manufacturing a chip-on-board type semiconductor device according to claim 14, further comprising the step of electrically connecting the output pads to the first ends of the circuit leads respectively before said step of molding.

16. A method of manufacturing a chip-on-board type semiconductor device according to claim 14, wherein said step of molding is performed with the second groove as an injection path for the sealing material.

17. A method of manufacturing a chip-on-board type semiconductor device according to claim 14, wherein said step of molding is performed with the second groove as an exhaustion path for air.

18. A method of manufacturing a chip-on-board type semiconductor device according to claim 14, further comprising the step of removing the press regions.

19. A method of manufacturing a chip-on-board type semiconductor device according to claim 18, wherein said step of removing is performed by stamp-pressing.

20. A method of manufacturing a chip-on-board type semiconductor device according to claim 14, further comprising the step of separating the semiconductor element supporting region from the bridging region of the circuit board after said step of molding.

21. A method of manufacturing a chip-on-board type semiconductor device according to claim 18, further including providing the circuit board with throughholes at the second ends of the circuit leads.

22. A method of manufacturing a chip-on-board type semiconductor device according to claim 21, further comprising providing the circuit board with a rear conductive pattern on the rear surface thereof, and providing the throughholes with a conductive path electrically connecting the conductive pattern and the rear conductive pattern.

* * * * *